United States Patent
Chellappa

(10) Patent No.: US 10,289,759 B1
(45) Date of Patent: May 14, 2019

(54) TESTING BATTERY USAGE BY APPLICATIONS

(71) Applicant: Amazon Technologies, Inc., Reno, NV (US)

(72) Inventor: Sridhar Chellappa, Karnataka (IN)

(73) Assignee: Amazon Technologies, Inc., Reno, NV (US)

( * ) Notice: Subject to any disclaimer, the term of this patent is extended or adjusted under 35 U.S.C. 154(b) by 405 days.

(21) Appl. No.: 13/732,844

(22) Filed: Jan. 2, 2013

(51) Int. Cl.
*G06F 17/50* (2006.01)

(52) U.S. Cl.
CPC ............................ *G06F 17/5009* (2013.01)

(58) Field of Classification Search
None
See application file for complete search history.

(56) References Cited

U.S. PATENT DOCUMENTS

| | | | |
|---|---|---|---|
| 6,081,098 A * | 6/2000 | Bertness et al. | 320/134 |
| 2005/0156603 A1* | 7/2005 | Lin et al. | 324/433 |
| 2010/0161506 A1* | 6/2010 | Bosenick et al. | 705/347 |
| 2012/0210325 A1* | 8/2012 | de Lind van Wijngaarden et al. | 718/103 |
| 2015/0350032 A1* | 12/2015 | Marsyla | H04W 24/10 715/740 |

OTHER PUBLICATIONS

Rice, Andrew, and Simon Hay. "Decomposing power measurements for mobile devices." Pervasive Computing and Communications (PerCom), 2010 IEEE International Conference on. IEEE, 2010.*

Donohoo, Brad K., Chris Ohlsen, and Sudeep Pasricha. "AURA: An application and user interaction aware middleware framework for energy optimization in mobile devices." Computer Design (ICCD), 2011 IEEE 29th International Conference on. IEEE, 2011.*

Zhang, Lide, et al. "Accurate online power estimation and automatic battery behavior based power model generation for smartphones." Proceedings of the eighth IEEE/ACM/IFIP international conference on Hardware/software codesign and system synthesis. ACM, 2010.*

Zhang, Xinwen, et al. "Towards an elastic application model for augmenting the computing capabilities of mobile devices with cloud computing." Mobile Networks and Applications 16.3 (2011): 270-284.*

Ding, Fangwei, et al. "Monitoring energy consumption of smartphones." Internet of Things (iThings/CPSCom), 2011 International Conference on and 4th International Conference on Cyber, Physical and Social Computing. IEEE, 2011.*

Keynote Device Anywhere, Oct. 17, 2012, Retrieved from https://web.archive.org/web/20121017100355/http://www.keynotedeviceanywhere.com/mobile-application-enterprise-testing.html.*

* cited by examiner

*Primary Examiner* — Saif A Alhija
*Assistant Examiner* — Bijan Mapar
(74) *Attorney, Agent, or Firm* — Baker & Hostetler LLP

(57) ABSTRACT

The effect on battery capacity of an application can be tested on computing devices. A server controller can instruct the computing devices to install applications and simulate user interactions with the applications. The controller can store indications of battery usage during the time that the simulated user interactions with the application are performed on the computing device. When battery capacity of the computing device is below a lower threshold, the controller can connect the computing device to a power supply. When the battery capacity of the computing device is again above an upper threshold, the controller can disconnect the computing device from the power supply and being testing a new application on the computing device.

26 Claims, 9 Drawing Sheets

TESTING BATTERY USAGE BY APPLICATIONS

BACKGROUND

Mobile computing devices can be powered by rechargeable batteries. Battery performance can be important to a user of a mobile computing device as battery performance typically determines how much and how long a user can use the mobile computing device before needing to recharge the battery. Applications running on the mobile computing device place demands on the mobile computing device that require power. Different applications use different amounts of power. Determining the effect that any one application has on battery performance can be difficult.

BRIEF DESCRIPTION OF THE DRAWINGS

Throughout the drawings, reference numbers may be re-used to indicate correspondence between referenced elements. The drawings are provided to illustrate example embodiments described herein and are not intended to limit the scope of the disclosure.

DETAILED DESCRIPTION OF ILLUSTRATIVE EMBODIMENTS

Knowing the effects of applications on battery capacity of mobile devices can be useful. Device manufacturers may want to select proper batteries for inclusion in their mobile devices that have sufficient battery capacity. Device manufacturers may want to test an application to certify that the application is suitable for use on their devices. Application providers, such as online application stores, may want to certify that applications are suitable for use on certain devices or on most devices. Application developers may want to know the effect of their applications on battery usage and, possibly, modify their applications accordingly.

Testing the effects of applications on battery capacity of mobile devices can be difficult and time-consuming. The effect of an application on battery usage can be tested manually where a user obtains an initial battery capacity values, installs and uses applications, and obtains final battery capacity values. However, this is labor-intensive as it requires significant interaction between a user and the device, and it is not reliable as it requires a user to accurately collect data and maintain constant all nonvariable testing parameters. In addition, attempts to automate the process have provided mostly unreliable data as it is difficult to determine actual battery usage while devices are connected to external power supplies.

The effects of applications on battery capacity of computing devices can be automatically tested in a system with a control server. The control server can control installation, use, and removal of applications from computing devices. The control server can also receive and store indications of battery capacity from the computing devices. The control server can also control the connection of a power supply to the computing devices. In such a system, the control server can cycle through testing applications on a computing device by connecting the computing device to a power supply until the battery capacity of the computing device is above an upper threshold, disconnecting the computing device from the power supply, instructing the computing device to install an application and simulate user interaction with the application, storing battery capacity data while the application is installed, instructing the computing device to uninstall the application when the battery capacity of the computing device is below a lower threshold, and connecting the computing device to the power supply until battery capacity of the computing device is again above the upper threshold and the process can be repeated with a new application. Such a testing cycle can be repeated on multiple computing devices in the system in parallel to continually and automatically test a number of applications on a number of computing devices.

Figure 1:
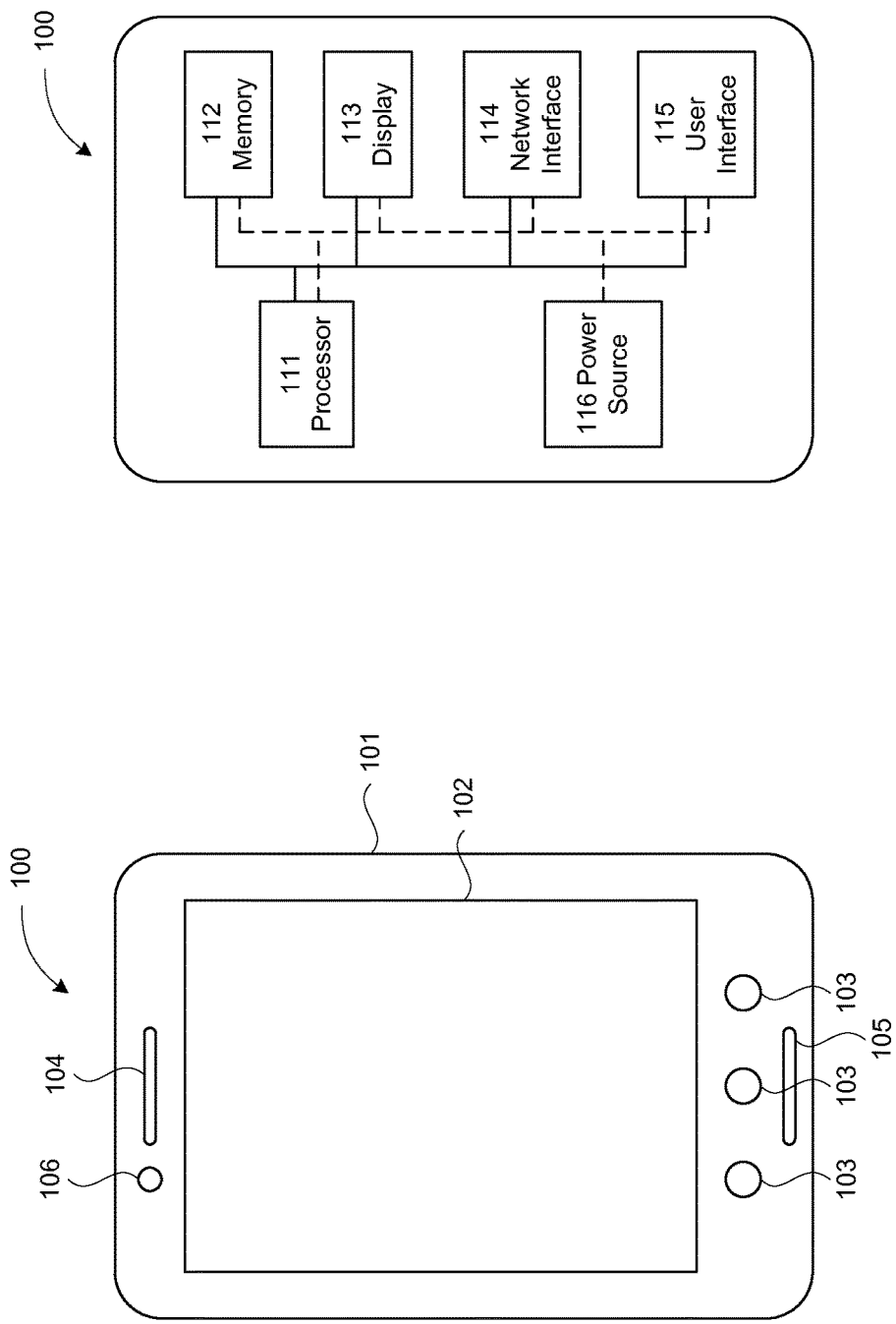
FIGS. 1A and 1B depict embodiments of external and internal components of a computing device.

FIG. 1A depicts an embodiment of an exterior of a computing device 100. It should be understood that this is merely an example for discussion, and that a number of additional components, configurations, assemblies, and combinations are possible as known in the art. Computing device 100 can be any form of a computer, such as a desktop computer or laptop computer, a tablet computing device, a cell phone, a handheld computing device, or any other form of computing device. Computing device 100 can include a housing 101. The housing 101 can be made of any material or combinations of materials, such as various types of plastic, metal, glass, and combinations thereof, that is suitable to house the components of device 100. Computing device 100 can also include a display 102 that can display images, text, any other type of visual information, and any combination thereof. Display 102 can also be a touchscreen display that is capable of sensing the presence and location of one or more touches of the display 102. A touchscreen display can sense touches by a user, such as a touch by a finger or a hand, and touches by objects, such as a stylus. Display 102 can be part of a user interaction system of the computing device 100.

Computing device 100 can also include one or more hard buttons 103 integrated into housing 101. In one embodiment, the one or more hard buttons 103 can include a single button, such as a home button or a power button. In another embodiment, the one or more hard buttons 103 can include a small set of buttons, such as a power button, a home button, and a back button. In yet another embodiment, the one or more hard buttons 103 can include a large set of buttons, such as a full QWERTY keyboard, a keypad, and the like. The one or more hard buttons 103 can be part of the user interaction system of the computing device 100.

Computing device 100 can also include a speaker 104 configured to emit sounds and a microphone 105 configured to receive sounds. In the embodiment where computing device 100 is a cell phone, speaker 104 and microphone 105 can be used to carry on a telephone call. In one embodiment, speaker 104 can be configured to play sounds associated with graphics displayed on display 102, such as during play of audiovisual material on computing device 100. In another embodiment, microphone 105 can receive audio sounds which the computing device 100 can interpret as user inputs. In addition, while not depicted in FIG. 1A, computing device 100 can also include an audio port which can be connected to an external microphone and/or an external speaker or speakers. Computing device 100 can send and receive audio signals via the audio port and interpret the received audio signals via the audio port just as it would interpret audio signals generated from sounds received by the microphone 105.

Computing device 100 can also include one or more optical devices 106. In one embodiment, an optical device can include an optical sensor, such as an infrared sensor, a visible light sensor, and/or any device that can sense light and/or electromagnetic energy. The detection of light and/or electromagnetic energy can be used by the computing device 100 to control components of the computing device 100, such as a level of light emitted by a backlight of display 102, illumination of one or more hard keys 103, and any other aspect of computing device 100. In another embodiment, an optical device can include an image-capturing device, such as a digital camera. An image-capturing device can include any device configured to capture an image, such as a complementary metal-oxide-semiconductor (CMOS) active pixel sensor (APS) and a charged coupled device (CCD). Images captured by one or more optical devices 106 can be stored by the computing device 100 as individual image or as a series of images in a video. Individual images and/or video images can be processed by computing device 100 and interpreted as user inputs. While FIG. 1A depicts one optical device 106 pointing in the same direction as the display 102, it is possible for computing device 100 to have any number of optical devices 106 and it is possible for one or more optical devices 106 to be pointed in other directions, such as a rear-facing camera pointing in the opposite direction of display 102.

FIG. 1B depicts an embodiment of internal components of a computing device 100. It should be understood that this is merely an example for discussion, and that a number of additional components, configurations, assemblies, and combinations are possible as known in the art. Computing device 100 can include at least one processor 111 that is able to execute instructions stored in one or more memories 112. The one or more memories 112 can include instructions for running an operating system, instructions for running one or more applications within the operating system, a system management agent, and any other kind of instructions. The at least one processor 111 can generate information on a display component 113. Display component 113 can include one or more of a display driver, a display card, display 102, or any other hardware and/or software required to display an image or series of images. Computing device 100 can also include a network interface 114 that allows the device to send and receive information signals via a network. Network interface 114 can include any type of network adapter for connecting to a network, such as an adapter to establish a connection to the Internet, to a wired or wireless intranet, to a cellular network, or to a wireless network. Computing device 110 can also include a user interface 115. User interface 115 can include one or more components, such as display 102, one or more hard buttons 103, speaker 104, microphone 105, and optical devices 106, that can provide information to a user and/or receive inputs from a user. User interface 115 can also include one or more external components, such as an external keyboard, external mouse, external microphone, external speaker, and the like.

Computing device 100 can include at least one power source 116. Power source 116 can provide power to any or all of the other components in computing device 100. As depicted in FIG. 1B, power source 116 can be connected to, and provide power to, each of processor 111, memory 112, display 113, network interface 114, and user interface 115. Power source can be any type of power source, such as one or more disposable batteries, a rechargeable battery, and the like. In the embodiment where computing device 100 is a portable device, such as a laptop computer, a tablet computer, a cell phone, a hand held computer, and the like, the power supply 116 may need to provide power for a period of time between recharging of the power source 116. When power source 116 is not connected to an external power source, computing device 100 is drawing on the power stored in power source 116. The capacity of power source 116 can vary with the type and size of power source 116. The rate at which power source 116 discharges depends on a number of factors, such as which components of computing device 100 are active, how much power each of the active components are drawing from power source 116, and the like.

Figure 2:
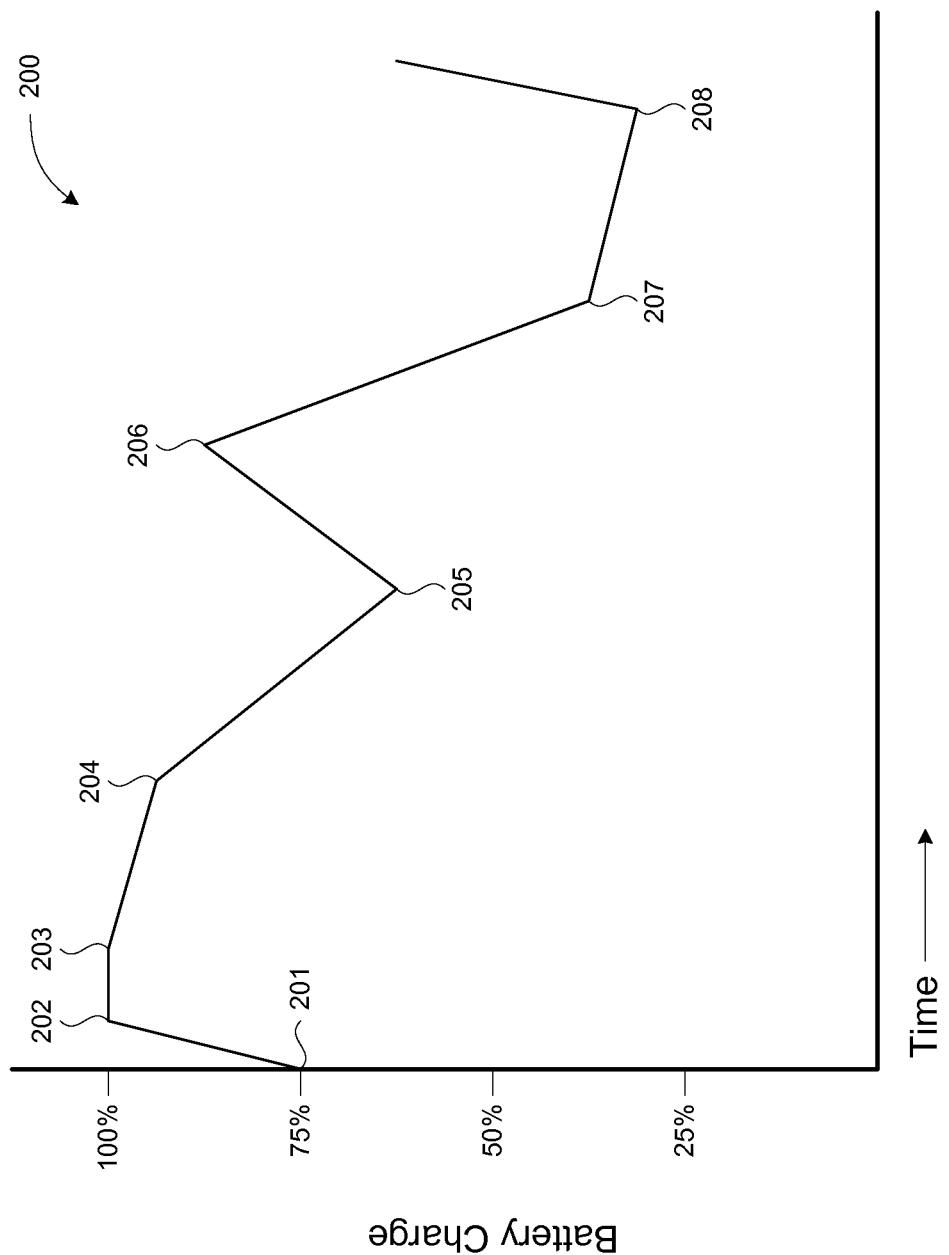
FIG. 2 depicts a chart showing an example of battery capacity of a computing device over time.

FIG. 2 depicts a chart 200 showing one example of battery capacity of a computing device over time. At point 201, the battery is not at full capacity, but the level of capacity is increasing. Battery capacity can increase when a battery is connected to an external power supply, such as when computing device is plugged in to a power outlet, when computing device is placed on an induction charging mat, and the like. From point 201, the capacity of the battery continues to increase until, at point 202, the battery is at or near capacity. From point 202 to point 203, the battery remains at or near capacity. This could happen, for example, when the computing device continues to be connected to an external power supply which provides sufficient power to the battery to remain at or near full capacity while the battery continues to provide power to the components of the computing device.

From point 203 to point 204, the battery capacity begins to decrease. For example, the computing device could have been disconnected from a power supply at point 203. Even when operating in an "idle" mode or a "sleep" mode, when many of the computing device's functions are inoperative, the computing device typically has some operations that draw power from the battery. Thus, even if the computing device is idle or in sleep mode at point 203, when the battery is disconnected from a power supply, some discharge of the battery will occur. From point 204 to point 205, the battery capacity continues to decrease at a faster rate than it was decreasing from point 203 to point 204. The increased rate of discharge may occur because the user has launched one or more applications on the computing device. Applications operating on the computing device demand operations from components of the computing device, such as display of graphics on a display, play of sounds through a speaker or audio port, network communications by a network interface, reception of user inputs through a user interface, and the like. As applications place demands on components of the computing device, the components draw more power from the battery. Thus, the launching and operation of one or more applications will reduce battery capacity at a greater rate than when the computing device is idle or in sleep mode.

At point 205, battery capacity begins to increase, and continues to increase until point 206. Battery capacity can increase when the battery is connected to a power supply. For example, at point 205, the user may have connected the computing device to an electrical outlet, to a computer port—such as a universal serial bus (USB) port—that provides power, to a battery of a car, to an induction pad by placing the computing device on the induction pad, or to any other source of power. During the time from point 205 to point 206, the computing device may continue to operate any applications that have been launched. In such a case, the external power source may be able to provide sufficient power to the computing device to satisfy all of the power demands of the computing device's components while still increasing the battery capacity.

At point 206, the battery capacity again begins to decrease. For example, the user may have disconnected the computing device from an external power supply. From point 206 to point 207, the battery capacity continues to decrease at a different rate than the battery capacity was decreasing from point 204 to point 205. The difference in discharge rate during those two periods may be due to a different number of applications being operated by the computing device during each period, due to different applications being operated by the computing device during each period, due to different levels of user interaction with the same application during each period, and due to any number of other reasons. From point 207 to point 208, the decrease in battery capacity continues, although at a much lower rate of discharge than the rate of discharge between points 206 and 207. In the time period from point 207 to point 208, the user may have closed all programs, returning the computing device to an idle mode, or placed the computing device into sleep mode. Although the computing device may be idle or in sleep mode from point 207 to point 208, the battery capacity continues to decrease. At point 208, the battery capacity again begins to increase. For example, at point 208, the user may have connected the computing device to an external power supply.

Testing the effect of an application or applications on battery capacity can provide useful information for device manufacturers, application developers, application providers, and others. In one embodiment, a device manufacturer may want to select a battery for inclusion in a computing device that has sufficient battery capacity for a user to run certain applications for a particular amount of time without needing to connect the computing device to an external power supply. Test data about the effect of an application or applications on battery capacity may be used by the manufacturer to select a battery for inclusion in the computing device. In another embodiment, a device manufacturer may want to certify applications for use on the manufacturer's computing devices. Test data about the effect of an application on battery capacity may be used by the manufacturer to determine whether the battery capacity of the manufacturer's computing devices can support the demands that may be placed on the computing devices' components by the application. In another embodiment, application providers, such as application stores, may want to certify applications for use on many or most computing devices. Test data about the effect of an application on battery capacity of a number of computing devices may be used by the manufacturer to determine whether the battery capacity of many or most computing devices can support the demands that may be placed on a computing device's components by the application. In yet another embodiment, application developers may want to know the effect of their applications on battery capacity of computing devices. Test data about the effect of an application on battery capacity of a number of computing devices may be used by an application developer to modify their applications to demand less power, to write new applications that use less power, and the like.

It may be helpful to provide a power usage rating or ranking system to users so that users have a metric to compare the power usage of new applications before downloading them. In one embodiment, an average power usage, a peak power usage, or some other rating of power usage can be associated with applications. Such power usage value or ranking can be provided by a developer of the application, by application store operators, by device manufactures, by other users, or by any other entities. Power usage value or rankings can be supplemented with individual reviews, such as recommendations to avoid using certain applications generally, to avoid using certain applications in power-critical situations, and the like.

While test data about the effect of an application or applications on battery capacity may be useful, obtaining such test data has been difficult to automate. In one testing example, a user can obtain an initial battery capacity value, install and use an application, and then obtain a final battery capacity value. The difference between the initial and final battery capacity values can be reported as the rate of discharge of the battery due to use of the application. While this example may produce testing data about the use of the application on a computing device, this process is labor-intensive because it requires one user to constantly interact with each computing device being tested. Because the process is labor-intensive it is difficult to scale to large numbers of computing devices and/or applications. In addition, such a testing process relies on the user to maintain all of the assumed testing parameters, such as not connecting the computing device to an external power source, using only the application being tested, recording the appropriate battery capacity levels at the appropriate times, and so on.

Figure 3:
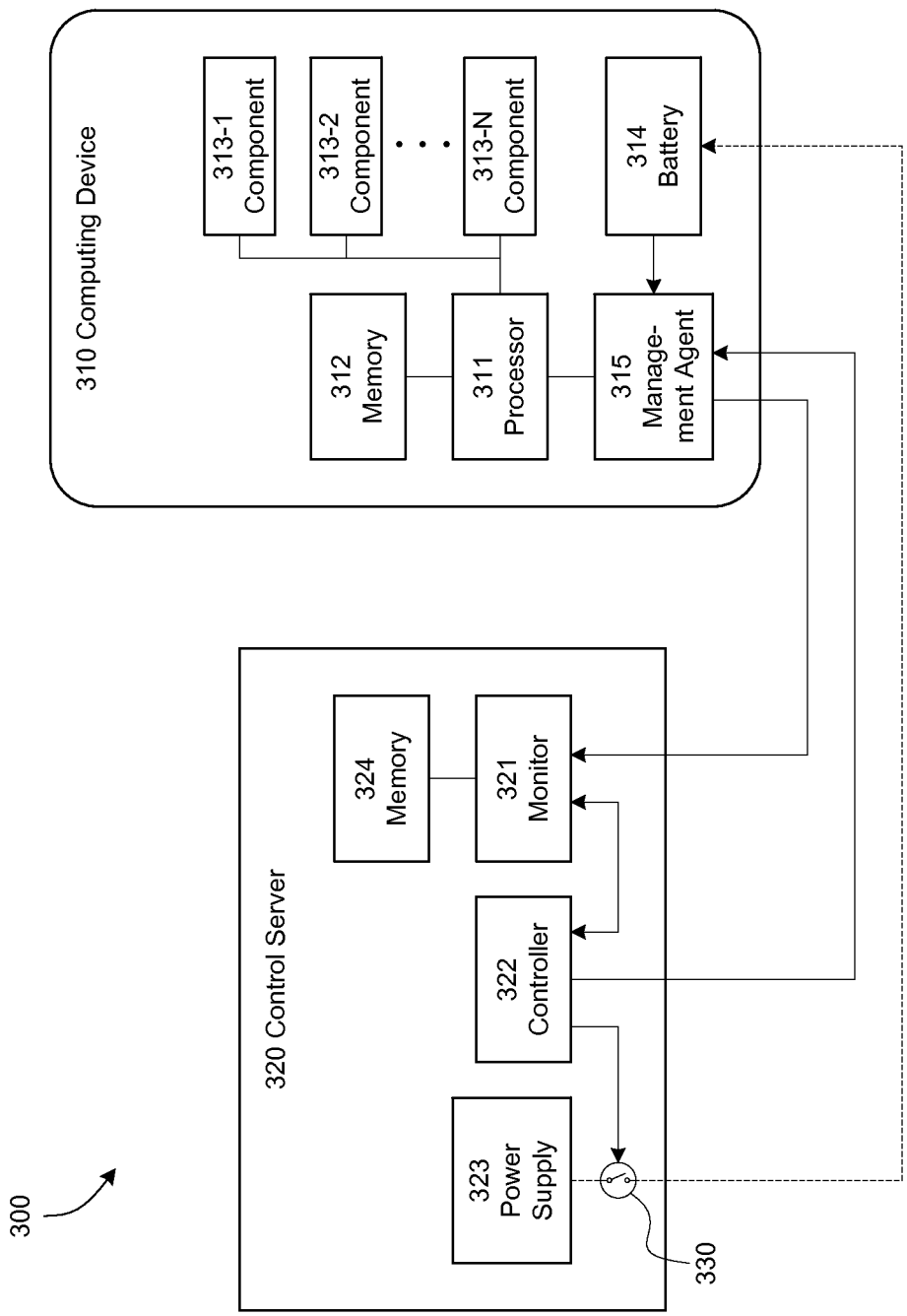
FIG. 3 depicts an embodiment of a system that can be used to automatically test the effect of an application on battery capacity of a computing device.

FIG. 3 depicts a system 300 that can be used to automatically test the effect of an application on battery capacity of a computing device. System 300 can include a computing device 310 and a control server 320. The computing device 310 can include a processor 311, memory 312, one or more components 313, battery 314, and management agent 315. The processor 311 can execute instructions stored in memories 312. The processor 311 can send control signals to components 313, which can include any or all of a display component, a network interface, a user interface, and the like. The battery 314 can provide power to each of the processor 311, memory 312, component or components 313, and management agent 315. Management agent 315 can be a tool that allows for control of the computing device 310 remotely. For example, management agent 315 can manage operations performed by the computing device 310, run shell commands on the computing device 310, copy files to or from the computing device 310, and the like. Management agent 315 can also simulate user interactions with the computing device 310 by generating and executing random or pseudo-random user-generated events, such as clicks, touches, gestures, system-level events, and the like. Management agent 315 can also provide reports, such as reports on the status of computing device 310, reports about usage of computing device 310, reports on status of components 313, reports on the status of battery 314, and the like. One example of management agent 315 is the ANDROID Debug Bridge.

Control server 320 can include a monitor 321, a controller 322, a power supply 323, and memory 324. Monitor 321 can receive reports from the management agent 315, such as indications of the capacity of battery 314 at particular times. Monitor 321 can store indications of the capacity of battery 314 in memory 324 and report indications of the capacity of battery 314 to controller 322. Controller can communicate with monitor 321 to indicate whether indications of the capacity of battery 314 should be stored in memory 324 at a particular time. Controller 322 can communicate with management agent 315 to instruct the computing device 310 to download files—such as application files—and store them in memory 312, to install applications on computing device 310, to uninstall applications from computing device 310, to simulate user interactions with an application on computing device 310, and the like. Controller 322 can also send control signals to a switch 330 between power supply 323 and battery 314. Battery 314 is connected to power supply 323 when the switch 330 is closed and battery 314 is not connected to power supply 323 when the switch 330 is open.

Figure 4:
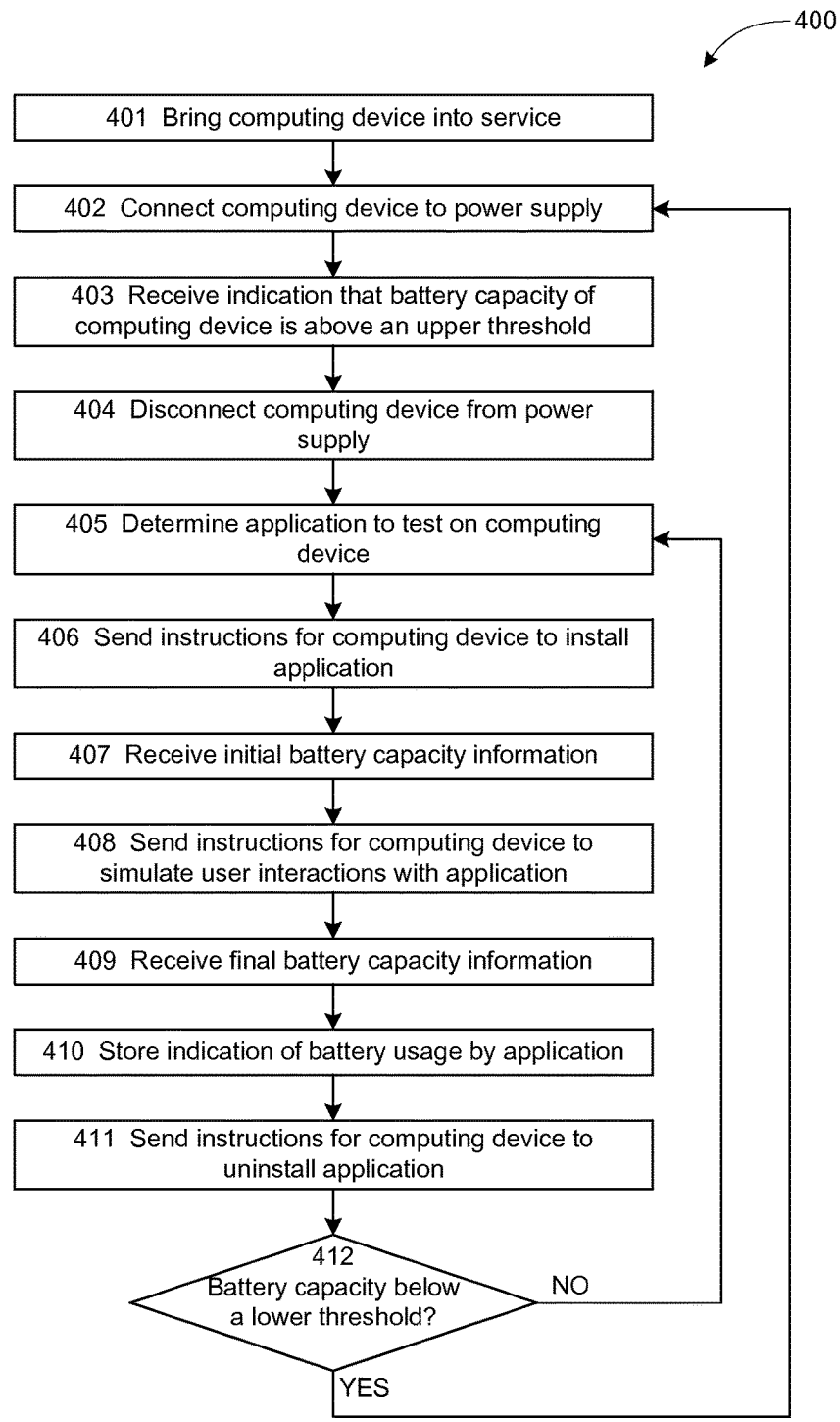
FIG. 4 depicts an embodiment of a method that can be used to automatically test the effect of an application on battery capacity of a computing device.

FIG. 4 depicts a method 400 that can be used to automatically test the effect of an application on battery capacity of a computing device. Various portions of the method 400 will be described here with respect to the system 300 depicted in FIG. 3, though it will be apparent to one of ordinary skill in the art that the method depicted in FIG. 4 could be performed by other systems and by variations on the system 300 depicted in FIG. 3. At block 401, a computing device can be brought into service for use with testing applications. At block 402, the computing device can be connected to an external power supply. In system 300, computing device 310 can be connected to power supply 323 by the controller 322 closing the switch 330 between power supply 323 and battery 314. At block 403, an indication can be received that the battery capacity of the computing device is above an upper threshold. The upper threshold may be a percentage of battery capacity, such as 95% of capacity, at which the computing device is determined to be ready to initiate a new test of an application. The upper threshold can be varied as deemed to be appropriate. In system 300, the monitor 321 can receive an indication from management agent 315 that the capacity of battery 314 is above an upper threshold. At block 404, the computing device can be disconnected from the external power supply. In system 300, computing device 310 can be disconnected from power supply 323 by the controller 322 opening the switch 330 between power supply 323 and battery 314.

At block 405, a determination can be made as to which application will be tested on the computing device. In system 300, the control server 320 can include a list of applications that are to be tested. The controller 322 can randomly select one of those applications for testing on computing device 310, or the controller 322 can select one of those applications for testing on computing device 310 based on a particular order. At block 406, instructions can be sent to the computing device to install the determined application. The instructions can include a location from which the computing device can download a file or files to install the application. In system 300, controller 322 can send instructions to management agent 315 to cause the computing device 310 to download the application and install the application. At block 407, an indication of an initial battery capacity can be received. The initial battery capacity can be an indication of the battery capacity before testing the application on the computing device. At block 408, instructions can be sent to the computing device to simulate user interactions with the application. When user interactions are simulated, the power demands by the various components of the computing device should draw on the battery as if a user was actually interacting with the application. Because the battery of the computing device is not connected to an external power supply, the battery capacity of the computing device should decrease as if a user was interacting with the application while the computing device was not connected to an external power supply. In system 300, the controller 322 can send instructions to management agent 315 to simulate user interactions. Management agent 315 can be configured to generate and/or execute random or pseudo-random user-generated events, such as clicks, touches, gestures, system-level events, key presses, and the like. Computing device 310 can respond to the simulated user interactions just as if a user was actually interacting with the application. At block 409, an indication of a final battery capacity can be received. The final battery capacity can be an indication of the battery capacity after testing the application on the computing device. At block 410, an indication of battery usage during the testing of the application can be stored. The indication of battery usage details can include both the initial battery capacity and the final battery capacity information, a value representative of the change from the initial battery capacity to the final battery, or any number of battery capacity values during testing of the application. The stored indications of battery usage can be useful, as described above, to device manufacturers, application developers, and application providers. At block 411, instructions can be sent to the computing device to uninstall the application.

At block 412, a determination can be made whether the battery capacity of the computing device is below a lower threshold. The lower threshold may be a percentage of battery capacity, such as 15% of capacity, at which the battery capacity is determined to be too low to continue testing an application. The lower threshold can be varied as deemed to be appropriate. In system 300, the monitor 321 can receive an indication from management agent 315 that the capacity of battery 314 is below a lower threshold. If the battery capacity is not below the lower threshold, then the computing device is available to test a new application. The process then returns to block 405 where a determination can be made to test a new application on the device. If the battery capacity is below a lower threshold, then the computing device needs to be recharged before testing a new application. The process then returns to block 402 where the computing device can be connected to an external power supply. In system 300, computing device 310 can be connected to power supply 323 by the controller 322 closing the switch 330 between power supply 323 and battery 314. At that point, the computing device can be recharged until battery capacity of the computing device is again over the upper threshold and the method can continue to test a new application. Using method 400, the computing device can be used repeatedly to test any number of applications over any number of battery capacity cycles of the computing device. In addition, the method can be automated, such as in the system 300 depicted in FIG. 3, such that user intervention is not required from one testing cycle to the next or from one recharging to the next. In this manner, battery capacity testing data for any number of applications can be automatically and repeatedly obtained.

Figure 5:
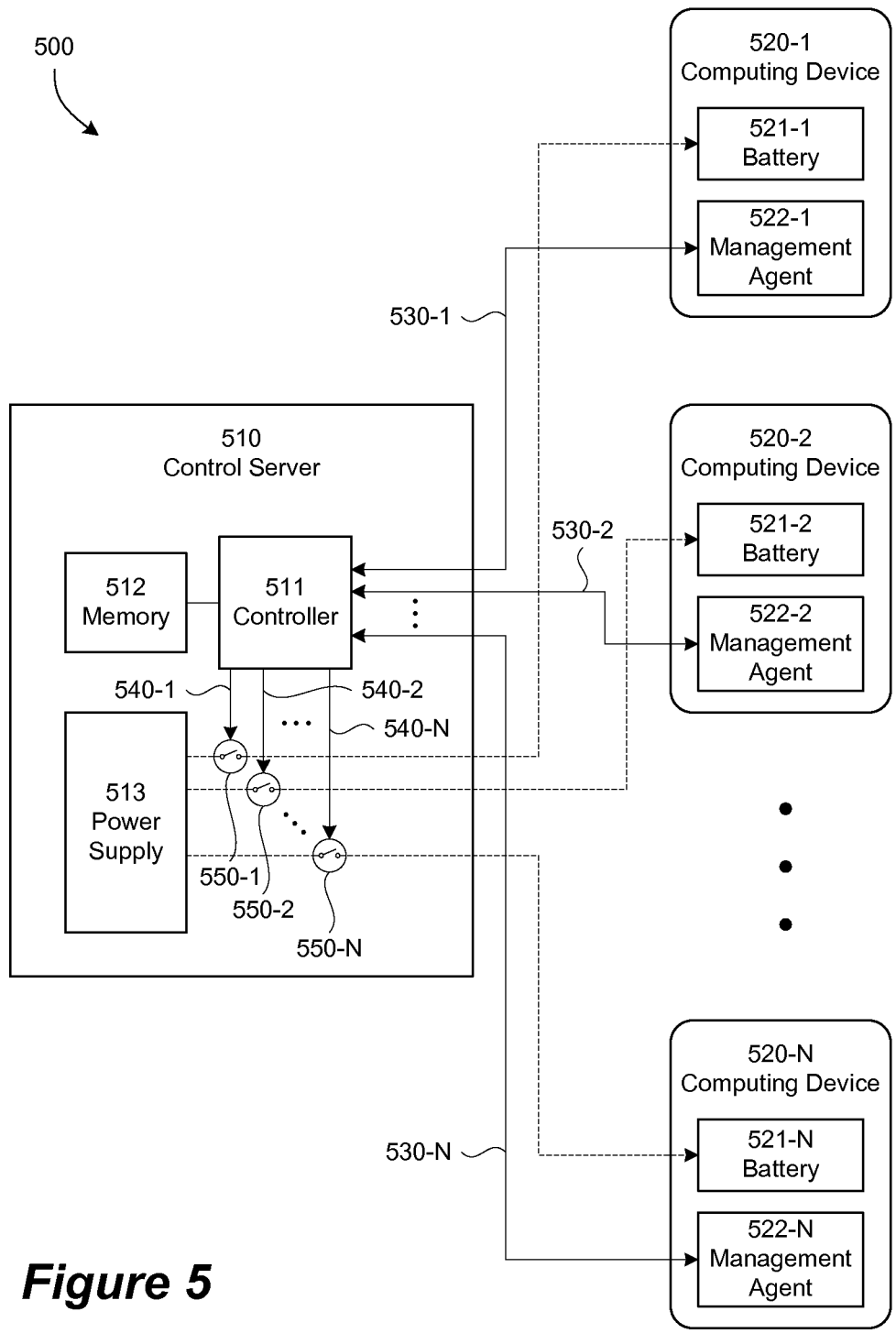
FIG. 5 depicts an embodiment of a system that can be used to automatically test the effects of application on battery capacity of a number of computing devices.

FIG. 5 depicts a system 500 that can be used to automatically test the effects of application on battery capacity of a number of computing devices. In the embodiment depicted in FIG. 5, system 500 includes a control server 510 and computing devices 520. Control server 510 includes a controller 511, a memory 512, and a power supply 513. Controller 511 can be configured to perform each of the functions discussed above with respect to the monitor 321 and the controller 322 depicted in system 300 of FIG. 3. Each of the computing devices 520 includes a battery 521 and a management agent 522. A communication link 530-1 can be established between controller 511 and management agent 522-1 of computing device 520-1. A communication link 530-2 can be established between controller 511 and management agent 522-2 of computing device 520-2. A communication link 530-N can be established between controller 511 and management agent 522-N of computing device 520-N. Communication links 530 can be wired links, wireless links, or any combination of wired and wireless links. For example, communication links can be wired local area network (LAN) links, wireless Wi-Fi links, or any other type of link that can be used to communicate information. Controller 511 can also control connections of power supply 513 to the batteries 521 of computing devices 520. A control signal 540-1 can be sent from controller 511 to a switch 550-1 located between power supply 513 and battery 521-1 of computing device 520-1. A control signal 540-2 can be sent from controller 511 to a switch 550-2 located between power supply 513 and battery 521-2 of computing device 520-2. A control signal 540-N can be sent from controller 511 to a switch 550-N located between power supply 513 and battery 521-N of computing device 520-N.

Using the system 500 depicted in FIG. 5, the method 400 can be performed with each device 520 in parallel. Controller 511 can independently monitor and send instructions to each of computing devices 520 to perform some or all of the method 400. For example, controller 511 can perform each of the steps after a battery capacity of computing device 520-1 reaches an upper threshold, the controller 511 can open the switch 550-1 to disconnect computing device 520-1 from the power supply 513, instruct computing device 520-1 to install an application and to simulate user interaction with the application, receive indications of the batter capacity of the computing device 520-1 during the simulated user interactions, store the received indications of batter capacity in memory 512, determine that the battery capacity of computing device 520-1 is lower than a lower threshold, close the switch 520-1, instruct the computing device 520-1 to uninstall the program, determine that the battery capacity of computing device 520-1 again is over an upper threshold, and repeat the process. The same process may be performed between controller 511 and each of computing device 520-2 to 520-N. Each of the processes being performed between controller 511 and computing devices 520 can be performed in parallel and automatically so that the computing devices are constantly cycling between charging and testing applications.

Controller 511 may also employ an active registry to list all of the computing devices 520 that are actively testing an application. When controller 511 receives an indication of battery capacity from any of the computing devices 520, the controller can determine whether to store the indication of the battery capacity in memory 512 based on whether the particular computing device 520 is listed on the active registry. Furthermore, the active registry may include an indication of an application being tested by each of the computing devices 520 listed on the active registry.

Figure 6:
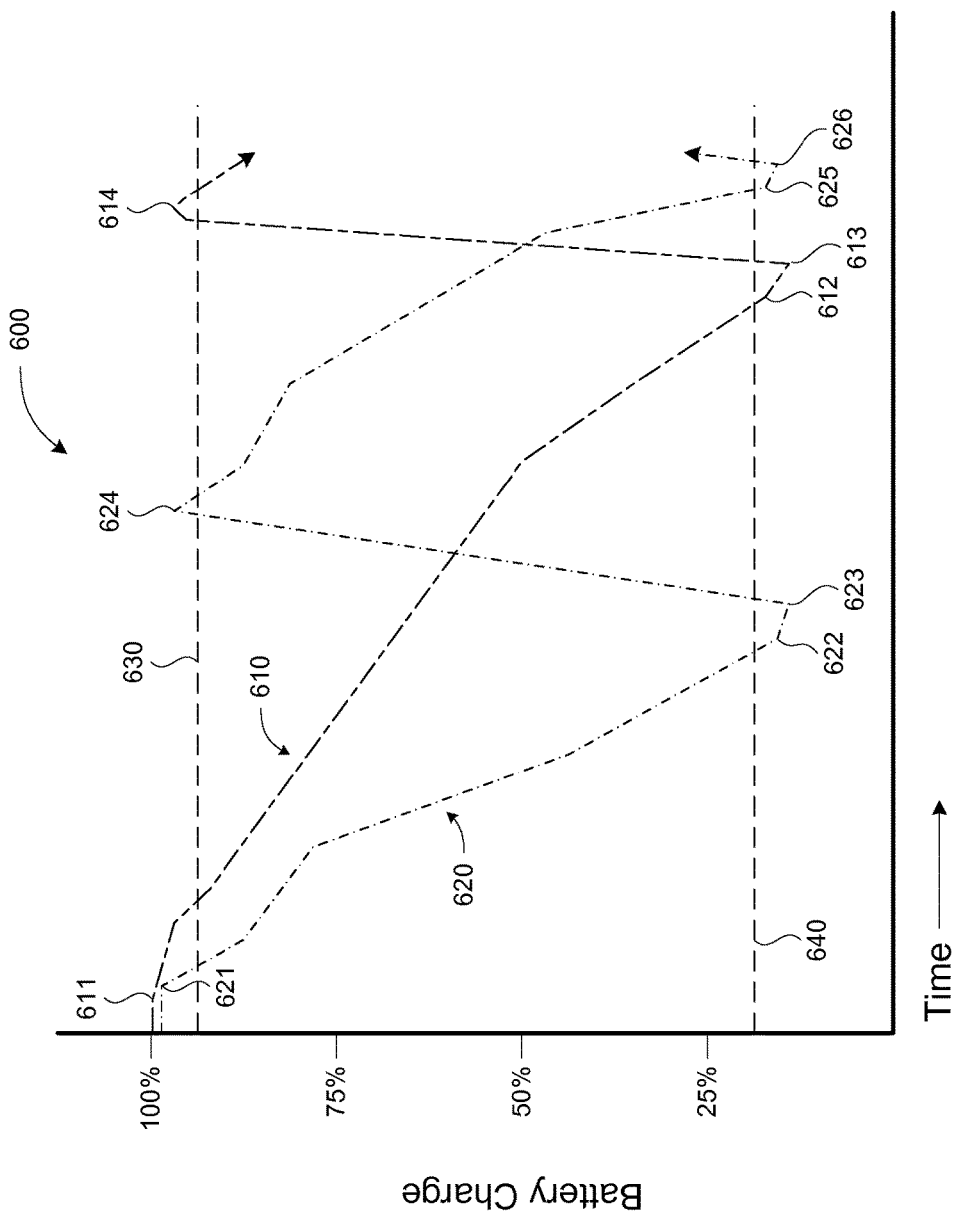
FIG. 6 depicts an embodiment of depicts a chart showing the battery capacity of two computing devices being tested in parallel.

FIG. 6 depicts a chart 600 showing the battery capacity of two computing devices that are being tested in parallel. Chart 600 includes a line-dash-line curve indicating a battery capacity 610 of a first computing device over time and a line-dot-line curve indicating a battery capacity 620 of a second computing device over time. Chart 600 also depicts an upper threshold 630 and a lower threshold 640. Starting from the left side of chart 600 the battery capacity 610 of the first computing device has a battery capacity over the upper threshold 630. At point 611, a controller can receive an indication of the battery capacity 610 of the first computing device, determine that the battery capacity 610 of the first computing device is over the upper threshold 630, disconnect the first computing device from an external power supply, send instructions to the first computing device to install an application, add the first computing device to an active registry, and send instructions to the first computing device to simulate user interactions with the installed application. After point 611, the battery capacity 610 of the first computing device decreases as the simulated user interactions with the application cause the application to request performance of certain functions by components of the first computing device and the components draw power from the battery of the first user device. The rate at which the battery capacity decreases may change over time as the simulated user interactions with the application result in more or less demand on the battery. The simulated user interactions continue until, at point 612, the controller receives an indication that the battery capacity 610 of the first computing device is below the lower threshold 640.

The controller may receive and store indications of effect of the simulated user interactions with the application between point 611 and point 612. In one embodiment, the controller can receive and store only an indication of the battery capacity at point 611 and an indication of the battery capacity at point 612. The effect of the battery capacity can be reflected as the change in battery capacity from point 611 to point 612 over the time period from point 611 to point 612. In another embodiment, the controller may receive indications of the battery capacity at point 611 and at point 612, and then store only an indication of the difference battery capacity from point 611 to point 612 over the time period from point 611 to point 612. In another embodiment, the controller may receive and store a number of indications of battery capacity between point 611 and point 612. The greater the number of indications that are stored, the more accurately the curve indicating the battery capacity 610 between points 611 and 612 can be reproduced.

At point 612, the controller can determine that the battery capacity 610 of the first computing device is below the lower threshold 640, send instructions to the first computing device to uninstall the application and remove the first computing device from the active registry. At point 613, controller can connect the first computing device to an external power supply, such as by closing a switch between the external power supply and the first computing device. From point 613 to point 614, the battery capacity 610 of the first computing device increases as the battery in the first computing device recharges. At point 614, the controller receives an indication of the battery capacity 610 of the first computing device, determines that the battery capacity 610 of the first computing device is over the upper threshold 630, and begins the process again to test another application.

Starting from the left side of chart 600 the battery capacity 620 of the second computing device has a battery capacity over the upper threshold 630. At point 621, the controller can receive an indication of the battery capacity 620 of the second computing device, determine that the battery capacity 620 of the second computing device is over the upper threshold 630, disconnect the second computing device from an external power supply, send instructions to the second computing device to install an application, add the second computing device to an active registry, and send instructions to the second computing device to simulate user interactions with the installed application. After point 621, the battery capacity 620 of the second computing device decreases as the user interactions with the application are simulated. The simulated user interactions continue until, at point 622, the controller receives an indication that the battery capacity 620 of the second computing device is below the lower threshold 640.

At point 622, the controller can determine that the battery capacity 620 of the second computing device is below the lower threshold 640, send instructions to the second computing device to uninstall the application and remove the second computing device from the active registry. At point 623, controller can connect the second computing device to an external power supply, such as by closing a switch between the external power supply and the second computing device. From point 623 to point 624, the battery capacity 620 of the second computing device increases as the battery in the second computing device recharges. At point 624, the controller receives an indication of the battery capacity 620 of the second computing device, determines that the battery capacity 620 of the second computing device is over the upper threshold 630, and begins the process again to test a new application. The testing of the new application decreases the battery capacity 620 of the second computing device until, at point 625, the controller receives an indication that the battery capacity 620 of the second computing device is again below the lower threshold 640. Instructions can be sent to the second computing device to uninstall the new application. At point 626, the controller can again connect the second computing device to the external power supply.

As can be seen in FIG. 6, the cycles of testing applications on computing devices and recharging computing devices after testing applications can be performed independently for each computing device. In the particular example depicted in FIG. 6, the first computing device appears to be cycling through application tests more slowly than the second computing device is cycling through application tests. The difference is cycle speeds may be due to a number of factors. In one example, the first and second computing devices may be different types of computing devices. The first computing device could be a tablet computer and the second computing device may be a handheld computing device. The battery of the tablet computer may hold a greater charge than the battery of the handheld computing device, taking longer for the battery capacity of the tablet computer to be reduced from the upper threshold to the lower threshold. In another example, the first and second computing devices may be the same type of computing device but different models, such as the case where the first and second computing devices are different models of cell phones. The second computing device may have components that are less efficient than the first computing device or may contain a battery that holds less of a charge than the battery of the first computing device. In another example, the first and second computing devices may be testing different types of applications. The second computing device may be testing a component-intensive application, such as an audiovisual content player or a location-based application, and the first computing device may be testing a less-component-intensive application, such as an email interface or a news reader application. There are many other factors and combinations of factors that could result in different rates that computing devices cycle through tests of applications.

As noted above, a system using multiple computing devices to test applications can include different types of computing devices and different models of any type of computing device. Having a variety of types and models of computing devices in a system will allow for an application to be tested on multiple computing device types and multiple computing device models. Testing an application on multiple computing device types and multiple computing device models can result in test data that can be used to determine how an application performs on many different devices, how different devices perform when executing the same application, and the like. When a controller receives an indication that a particular computing device in the system has a battery capacity over an upper threshold, the controller can determine which application to test on that particular computing device. The controller may take into account the type and/or model of the computing device to determine which application will be tested on the particular computing device. The controller may also reference a schedule to determine which application will be tested on the particular computing device. The schedule can indicate applications that need to be tested on various ones of the computing devices in the system.

Figure 7:
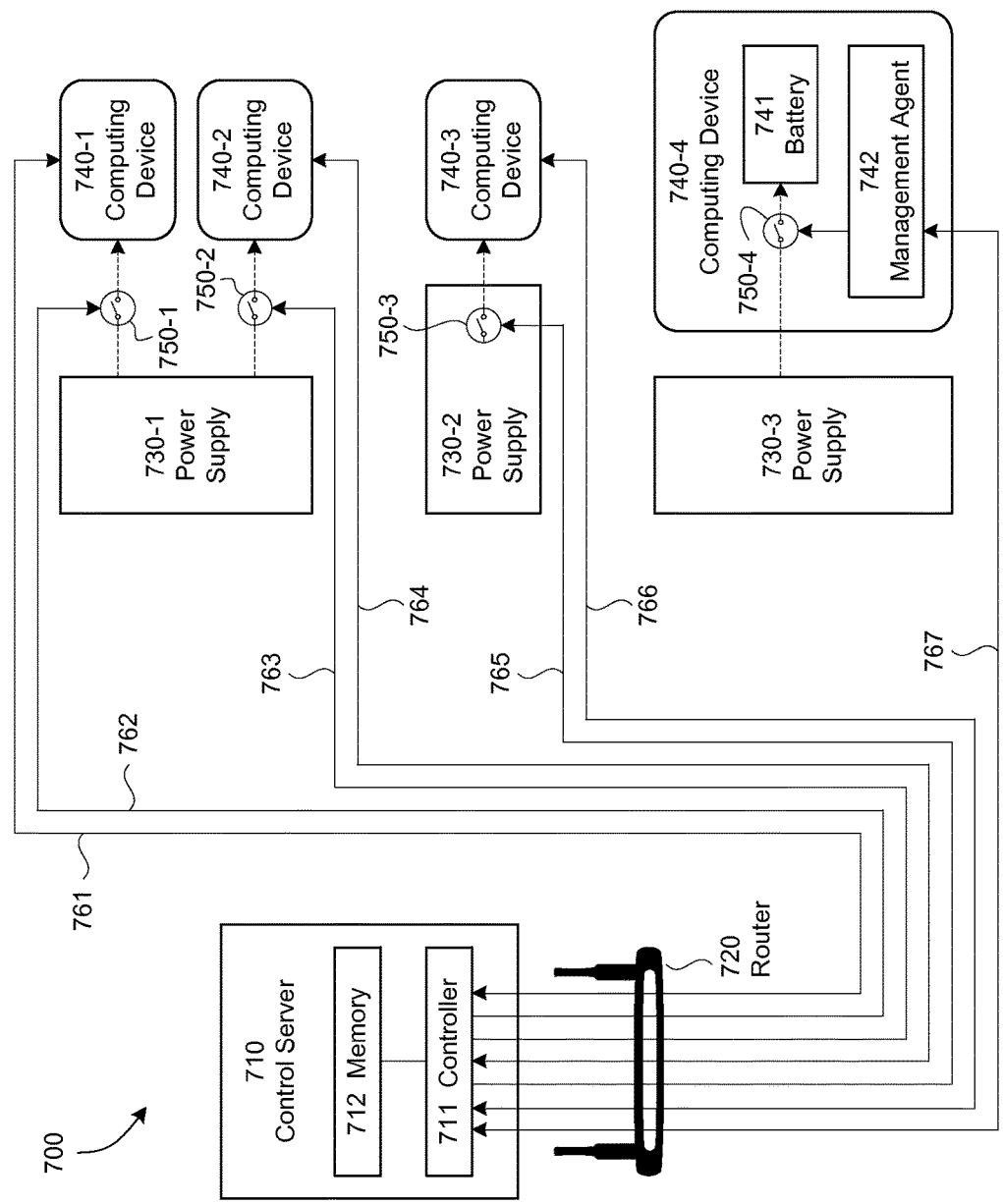
FIG. 7 depicts an embodiment of a system that can be used to automatically test the effects of applications on battery capacity of a number of computing devices.

FIG. 7 depicts a system 700 that can be used to automatically test the effects of applications on battery capacity of a number of computing devices. In the embodiment depicted in FIG. 7, system 700 includes a control server 710, a router 720, external power supplies 730, computing devices 740, and switches 750. Control server 710 includes a controller 711 and memory 712. Controller 711 can be configured to perform each of the functions discussed above with respect to the monitor 321 and the controller 322 depicted in system 300 of FIG. 3 and with respect to the controller 511 depicted in system 500 of FIG. 5. Although not shown in each of the computing devices 740, each of the computing devices 740 can include a battery and a management agent, such as the battery 741 and the management agent 742 depicted in computing device 740-4. As depicted in FIG. 7, power supplies 730 can be external to both the control server 710 and computing devices 740. A single power supply can be connectable to multiple computing devices, such as in the case of power supply 730-1 being connectable to each of computing devices 740-1 and 740-2. A single power supply can also be connectable to a single computing device, such as in the cases of power supply 730-2 being connectable to computing device 740-3 and power supply 730-3 being connectable to computing device 740-4.

Switches 750 can be located at any location between a power supply and a computing device. In one embodiment, switches can be external to a control server, to a power supply, and to a computing devices, such as in the case of switches 750-1 and 750-2 which are external to control server 710, power supply 730-1, and computing devices 740-1 and 740-2. In another embodiment, a switch can be located within a power supply, such as in the case of switch 750-3 located within power supply 730-2. In another embodiment, a switch can be located within a computing device, such as in the case of switch 750-4 located within computing device 740-4. As depicted, switch 750-4 can receive control signals from management agent 742. In another embodiment depicted in FIGS. 3 and 5, a switch can be located within a control server, such as switch 330 inside of control server 320 in FIG. 3 and switches 550 inside of control server 510 in FIG. 5.

Communication links can be established between controller 711 and various other components of system 700. A communication link 761 can be established between controller 711 and computing device 740-1 via router 720. The communication link 761 can allow for communications from controller 711 to computing device 740-1, such as sending instructions to install an application, and from computing device 740-1 to controller 711, such as reporting indications of battery capacity. Similarly, a communication link 764 can be established between controller 711 and computing device 740-2, and a communication link 766 can be established between controller 711 and computing device 740-3. A communication link 762 can be established between controller 711 and switch 750-1 via router 720. The communication link 762 can allow for communications from controller 711 to switch 750-1, such as instructions to close or open switch 750-1. Similarly, a communication link 763 can be established between controller 711 and switch 750-2, and a communication link 765 can be established between controller 711 and switch 750-3. A communication link 767 can be established between controller 711 and computing device 740-4 via router 720. The communication link 767 can allow for communications from controller 711 to computing device 740-4, such as sending instructions to install an application, and from computing device 740-4 to controller 711, such as reporting indications of battery capacity. The communication link 767 can also carry instructions to management agent 742 to open or close switch 750-4. Router 720 can be a wireless router, such as the particular router depicted in FIG. 7. Router 720 can also be a wired router, a combination of different routers, and any other configuration or combination of routers.

Figure 8:
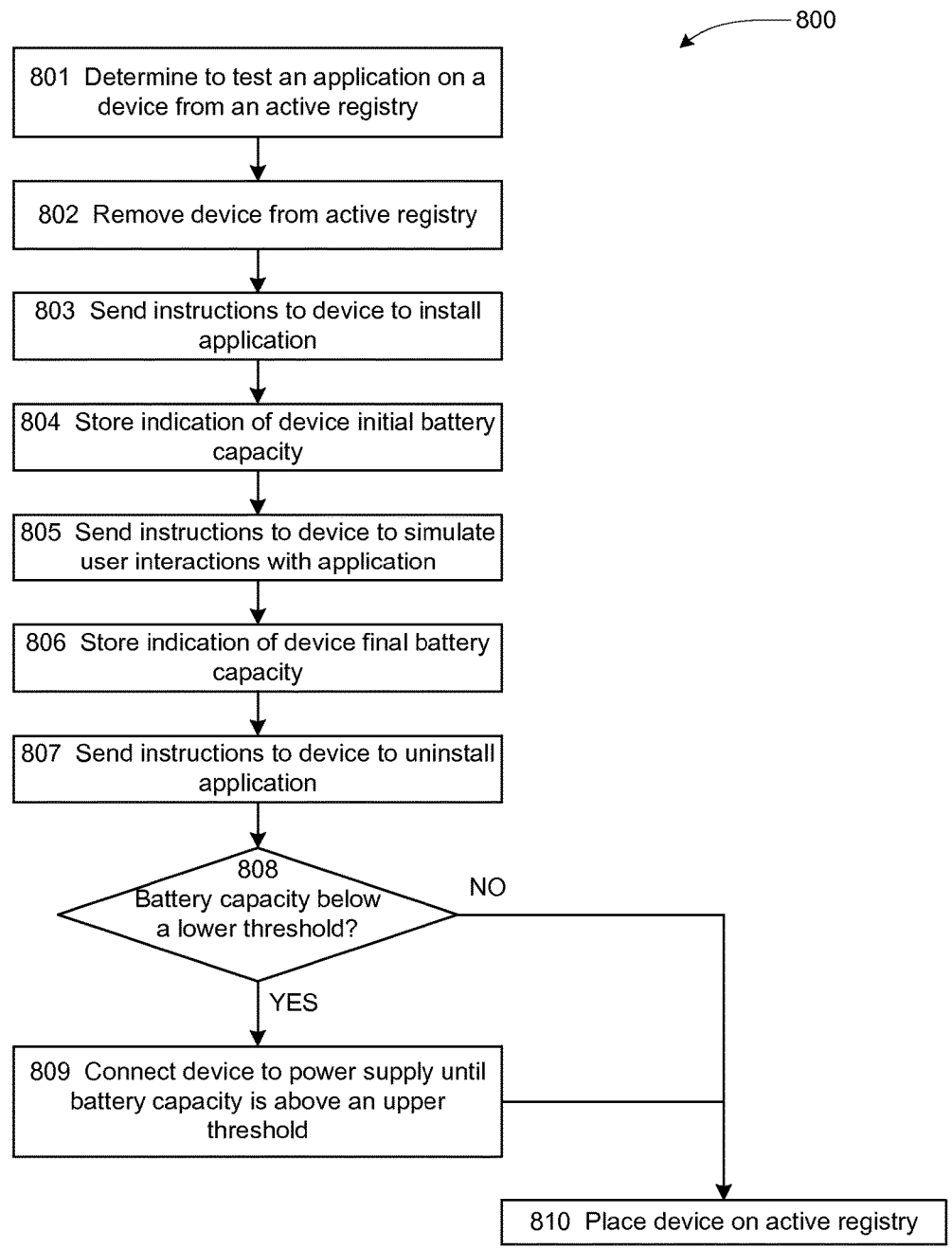
FIG. 8 depicts an embodiment of a method that can be used to automatically test the effect of an application on battery capacity of a number of computing devices.

FIG. 8 depicts a method 800 that can be used to automatically test the effect of an application on battery capacity of a number of computing devices and an active registry. While the method may be used in the systems depicted in FIGS. 5 and 7, there are any number of other systems and configurations of systems that could perform the method 800 depicted in FIG. 8. The activity registry can be a list of those computing devices that are available for testing an application. For example, in system 500, the control server 510 can maintain an active registry of computing devices that are available for testing an application. Controller 511 can include a scheduler that schedules when certain applications are executed on certain devices. The controller 511 and/or scheduler can use the active registry to determine those devices that are available to start a new test of an application. At block 801, a determination can be made to test an application on a computing device on the active registry. The determination may be made by a controller or by a scheduler associated with a controller. In making the determination of the application to test on the computing device, the controller may take into account any one of a type of the computing device, a model of the computing device, a schedule of applications to be tested, or any combination thereof. At block 802, the selected computing device is removed from the active registry. Removing the computing device from the active registry can be an indication that the selected computing device is not currently available to test another application.

At block 803, instructions can be sent to the computing device to install the application. The instructions to install the application can be sent from a controller to a management agent of the computing device. The management agent of the computing device can take steps to install the application on the computing device after the file or files are obtained. At block 804, an initial battery capacity indication can be stored. The initial battery indication can indicate the battery charge before testing the application. When stored in memory, the initial battery charge can persist until needed for analysis. At block 805, instructions can be sent to the computing device to simulate interaction with the application. The management agent can also generate and/or execute random or pseudo-random simulated user-generated events to interact with the application, such as clicks, touches, gestures, system-level events, and the like. At block 806, a final batter capacity indication can be stored. The final battery indication can indicate the battery charge after testing the application. At block 807, instructions can be sent to the computing device to uninstall the application. The instructions can be sent to a management agent of the computing device which can take the necessary steps to uninstall the application. The management agent can also delete any files on the computing device associated with the application.

At block 808, a determination can be made whether the battery capacity of the device is below a lower threshold. If the battery capacity of the device is below a lower threshold then, at block 809, the computing device can be connected to a power supply. Connecting the power supply to the battery of the computing device can include closing a switch located on an electrical connection between the power supply and the battery. The computing device can remain connected to the power supply until the battery capacity of the computing device exceeds an upper threshold. After the battery capacity of the computing device is above the upper threshold, the computing device can be disconnected from the power supply. Then, at block 810, the computing device can be placed onto the active registry. Placing the computing device on the active registry can indicate that the computing device is available for testing a new application. Returning back to block 808, if the battery capacity of the device is not below a lower threshold, then the computing device is available for testing a new application without needing to be recharged. In this case, the process can proceed directly to block 810 where the computing device is placed on the active registry.

The process depicted in FIG. 8, can be set up to run automatically by a controller so that no user intervention is required. In addition, in a system with a number of computing devices operating independently to cycle through tests of applications, a controller may perform the process depicted in FIG. 8 independently and in parallel with each computing device. In one example, while a controller can be performing any of the steps 802 through 810 with a first computing device while starting also performing step 801 to determine to test an application on a second computing device listed on the active registry.

Figure 9:
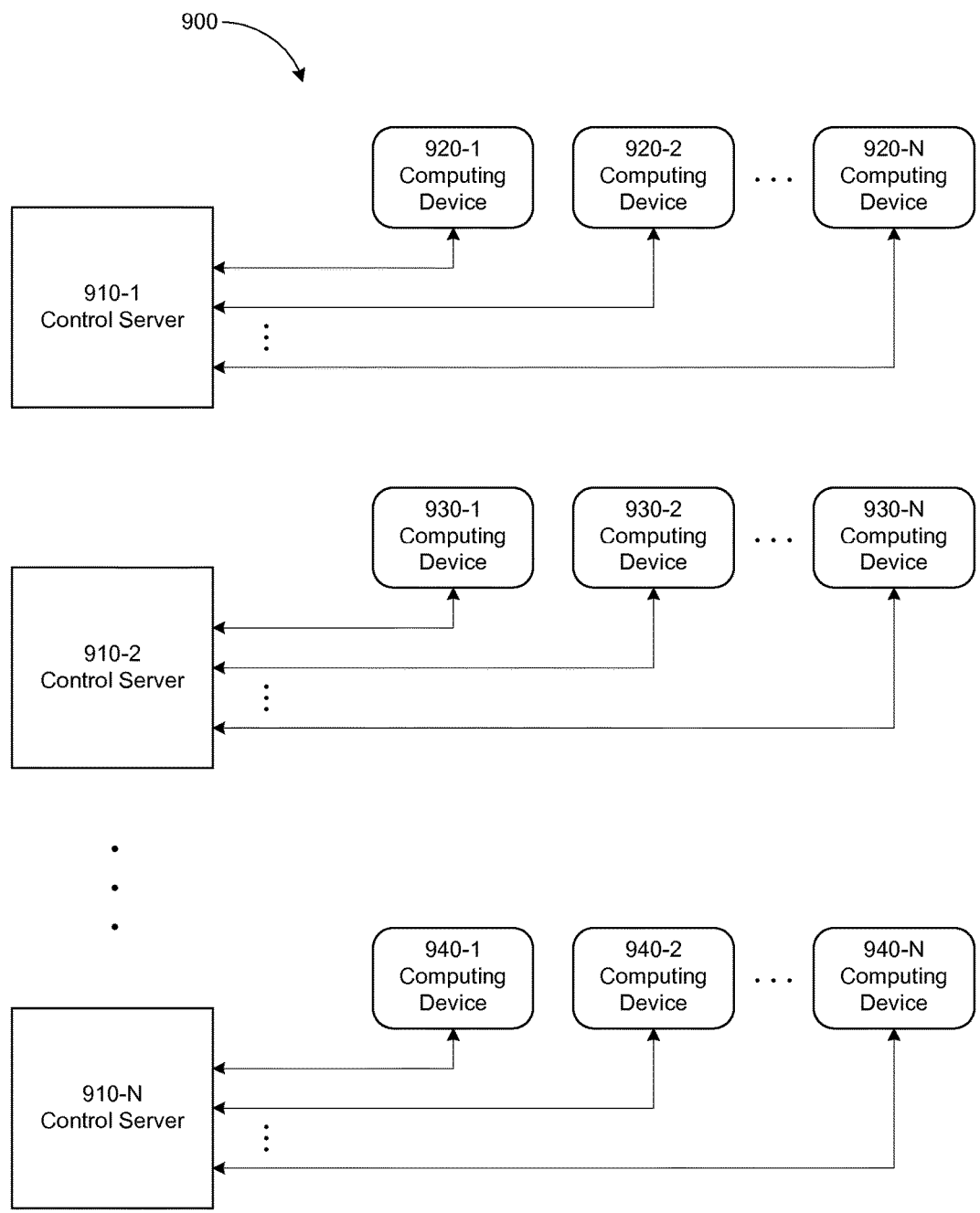
FIG. 9 depicts an embodiment of a system that includes multiple control servers that can be used to automatically test the effects of applications on battery capacity of a number of computing devices.

FIG. 9 depicts an embodiment of a system that includes multiple control servers that can be used to automatically test the effects of applications on battery capacity of a number of computing devices. The system 900 includes a number of control servers 910, each of which are able to communicate with a number of computing devices 920, 930, and 940. Control server 910-1 can send instructions to each of computing devices 920-1, 920-2, . . . , 920-N to install applications and simulate user interactions with the applications, and control server 910-1 can store indications of battery usage of computing devices 920-1, 920-2, . . . , 920-N during simulated user interactions with a given application. As the battery capacity of each of computing devices 920-1, 920-2, . . . , 920-N falls below a lower threshold, control server 910-1 can independently connect each of computing devices 920-1, 920-2, . . . , 920-N to one or more power supplies (not shown) until the battery capacity exceeds an upper threshold. Control server 910-2 can interact with computing devices 930-1, 930-2, . . . , 930-N and control server 910-N can interact with computing devices 940-1, 940-2, . . . , 940-N in ways similar to those described with respect to control server 910-1 and computing devices 920-1, 920-2, . . . , 920-N. In this manner, the system 900 can scale up to include any number of computing devices and any number of control servers needed to control the computing devices.

Each of the processes, methods, and algorithms described in the preceding sections may be embodied in, and fully or partially automated by, code modules executed by one or more computers or computer processors. The code modules may be stored on any type of non-transitory computer-readable medium or computer storage device, such as hard drives, solid state memory, optical disc, and/or the like. The processes and algorithms may be implemented partially or wholly in application-specific circuitry. The results of the disclosed processes and process steps may be stored, persistently or otherwise, in any type of non-transitory computer storage such as, e.g., volatile or non-volatile storage.

The various features and processes described above may be used independently of one another, or may be combined in various ways. All possible combinations and subcombinations are intended to fall within the scope of this disclosure. In addition, certain method or process blocks may be omitted in some implementations. The methods and processes described herein are also not limited to any particular sequence, and the blocks or states relating thereto can be performed in other sequences that are appropriate. For example, described blocks or states may be performed in an order other than that specifically disclosed, or multiple blocks or states may be combined in a single block or state. The example blocks or states may be performed in serial, in parallel, or in some other manner. Blocks or states may be added to or removed from the disclosed example embodiments. The example systems and components described herein may be configured differently than described. For example, elements may be added to, removed from, or rearranged compared to the disclosed example embodiments.

It will also be appreciated that various items are illustrated as being stored in memory or on storage while being used, and that these items or portions of thereof may be transferred between memory and other storage devices for purposes of memory management and data integrity. Alternatively, in other embodiments some or all of the software modules and/or systems may execute in memory on another device and communicate with the illustrated computing systems via inter-computer communication. Furthermore, in some embodiments, some or all of the systems and/or modules may be implemented or provided in other ways, such as at least partially in firmware and/or hardware, including, but not limited to, one or more application-specific integrated circuits (ASICs), standard integrated circuits, controllers (e.g., by executing appropriate instructions, and including microcontrollers and/or embedded controllers), field-programmable gate arrays (FPGAs), complex programmable logic devices (CPLDs), etc. Some or all of the modules, systems and data structures may also be stored (e.g., as software instructions or structured data) on a computer-readable medium, such as a hard disk, a memory, a network, or a portable media article to be read by an appropriate drive or via an appropriate connection. The systems, modules and data structures may also be transmitted as generated data signals (e.g., as part of a carrier wave or other analog or digital propagated signal) on a variety of computer-readable transmission media, including wireless-based and wired/cable-based media, and may take a variety of forms (e.g., as part of a single or multiplexed analog signal, or as multiple discrete digital packets or frames). Such computer program products may also take other forms in other embodiments. Accordingly, the present invention may be practiced with other computer system configurations.

Conditional language used herein, such as, among others, "can," "could," "might," "may," "e.g.," and the like, unless specifically stated otherwise, or otherwise understood within the context as used, is generally intended to convey that certain embodiments include, while other embodiments do not include, certain features, elements, and/or steps. Thus, such conditional language is not generally intended to imply that features, elements and/or steps are in any way required for one or more embodiments or that one or more embodiments necessarily include logic for deciding, with or without author input or prompting, whether these features, elements and/or steps are included or are to be performed in any particular embodiment. The terms "comprising," "including," "having," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list.

While certain example embodiments have been described, these embodiments have been presented by way of example only, and are not intended to limit the scope of the inventions disclosed herein. Thus, nothing in the foregoing description is intended to imply that any particular feature, characteristic, step, module, or block is necessary or indispensable. Indeed, the novel methods and systems described herein may be embodied in a variety of other forms; furthermore, various omissions, substitutions and changes in the form of the methods and systems described herein may be made without departing from the spirit of the inventions disclosed herein. The accompanying claims and their equivalents are intended to cover such forms or modifications as would fall within the scope and spirit of certain of the inventions disclosed herein.

What is claimed is:

1. A method for testing battery usage by a first application and a second application on one or more computing devices, the method comprising:

sending instructions to a management agent of a first computing device to install the first application on the first computing device selected from a plurality of applications, the first application being configured to demand operations from components of the computing device in response to one or more user interactions with the first application;

sending instructions to the management agent of the first computing device to simulate user interactions with the first application;

storing an indication of battery usage of the first application caused by the simulated user interactions during the usage of the application based, at least in part, on an indication of battery capacity of the first computing device before the simulated user interactions with the first application and an indication of battery capacity of the first computing device after the simulated user interactions with the first application;

sending instructions to the management agent of the first computing device to install the second application on the first computing device;

sending instructions to the management agent of the first computing device to simulate user interactions with the second application;

storing an indication of battery usage of the second application caused by the simulated user interactions during the usage of the application based, at least in part, on an indication of battery capacity of the first computing device before the simulated user interactions with the second application and an indication of battery capacity of the first computing device after the simulated user interactions with the second application; and in response to determining that the battery capacity of the first computing device is below a lower threshold, connecting the first computing device to one or more power supplies until the battery capacity of the first computing device is above an upper threshold.

2. The method of claim 1, wherein connecting the first computing device to the one or more power supplies comprises closing a switch located on an electrical connection between the one or more power supplies and the first computing device.

3. The method of claim 1, further comprising:

sending instructions to a management agent of a second computing device to install one of a first application, the second application, or a third application on the second computing device;

sending instructions to the management agent of the second computing device to simulate user interactions with the one of a first application, the second application, or the third application; and storing an indication of battery usage of the one of a first application, the second application, or the third application based, at least in part, on an indication of battery capacity of the first computing device before the simulated user interactions with the one of a first application, the second application, or the third application and an indication of battery capacity of the first computing device after the simulated user interactions with the one of a first application, the second application, or the third application.

4. The method of claim 3, wherein the first computing device and the second computing device are the same type of computing device.

5. The method of claim 3, wherein the first computing device and the second computing device are different models of the same type of computing device.

6. The method of claim 1, further comprising:

comparing the battery usage of the first application with the battery usage of the second application.

7. The method of claim 6, further comprising:

providing a comparison of the battery usage of the first application with the battery usage of the second application to one or more of a group consisting of a potential user of the first or second application, a developer of the first or second application, and a manufacturer of the first computing device.

8. The method of claim 3, further comprising:

in response to determining that the battery capacity of the second computing device is below the lower threshold, connecting the second computing device to the one or more power supplies until the battery capacity of the second computing device is above the upper threshold.

9. The method of claim 1, further comprising:

maintaining an active registry, the active registry comprising a list of one or more of a plurality of computing devices that are available to test an application.

10. The method of claim 9, further comprising:

determining that the first computing device is available to test the first application by determining that the first computing device is listed on the active registry.

11. A system for testing battery usage, the system comprising:

a first computing device;

a second computing device;

one or more memories; and a controller comprising instructions that, upon execution, at least cause the controller to:

instruct the first computing device to install a first application selected from a plurality of applications, the first application being configured to demand operations from components of the computing device in response to one or more user interactions with the first application, instruct the first computing device to simulate user interactions with the first application, store, in the one or more memories, an indication of battery usage of the first computing device caused by the simulated user interactions during the simulated user interactions of the first computing device with the first application, instruct the second computing device to install the first application, instruct the second computing device to simulate user interactions with the first application, and store, in the one or more memories, an indication of battery usage of the second computing device caused by the simulated user interactions during the simulated user interactions of the second computing device with the first application.

12. The system of claim 11, the system further comprising:

one or more power supplies;

wherein the controller further comprises instructions that, upon execution, at least cause the controller to:

determine that battery capacity of one of the first or second computing devices is below a lower threshold, and connect the one of the first or second computing devices to the one or more power supplies until the battery capacity of the one of the first or second computing devices is above an upper threshold.

13. The system of claim 11, wherein the controller is configured to communicated with each of the first and second computing devices via one or more of a wireless communication link and a wired communication link.

14. The system of claim 11, wherein the controller comprises:

a monitor configured to receive one or more battery capacity indications from the first and second computing devices, each of the one or more battery capacity indications comprising an indication of a battery capacity of the first computing device.

15. The system of claim 11, wherein the controller further comprises instructions that, upon execution, at least cause the controller to:

determine a ranking of the first application based, at least in part, on the battery usage of the first computing device during the simulated user interactions of the first computing device with the first application and the battery usage of the second computing device during the simulated user interactions of the second computing device with the first application.

16. The system of claim 15, wherein the controller further comprises instructions that, upon execution, at least cause the controller to:
provide the ranking of the first application to one or more of a group consisting of a potential user of the first or second application, a developer of the first or second application, and a manufacturer of the first computing device.

17. The system of claim 11, wherein the controller further comprises instructions that, upon execution, at least cause the controller to:
instruct the first computing device to uninstall the first application; and
in response to determining that the battery capacity of the first computing device is above a lower threshold:
instruct the first computing device to install a second application,
instruct the first computing device to simulate user interactions with the second application, and
store, in the one or more memories, an indication of battery usage of the first computing device during the simulated user interactions of the first computing device with the second application.

18. The system of claim 17, wherein the controller further comprises instructions that, upon execution, at least cause the controller to:
instruct the second computing device to uninstall the first application; and
in response to determining that the battery capacity of the second computing device is above the lower threshold:
instruct the second computing device to install the second application,
instruct the second computing device to simulate user interactions with the second application, and
store, in the one or more memories, an indication of battery usage of the second computing device during the simulated user interactions of the second computing device with the second application.

19. The system of claim 18, wherein the controller further comprises instructions that, upon execution, at least cause the controller to:
determine a ranking of the second application based, at least in part, on the battery usage of the first computing device during the simulated user interactions of the first computing device with the second application and the battery usage of the second computing device during the simulated user interactions of the second computing device with the second application.

20. The system of claim 19, wherein the controller further comprises instructions that, upon execution, at least cause the controller to:
provide the ranking of the second application to one or more of a group consisting of a potential user of the first or second application, a developer of the first or second application, and a manufacturer of the first computing device.

21. A non-transitory computer-readable storage medium having stored thereon computer readable instructions, the computer-readable instructions comprising instructions that, upon execution on a computing device, at least cause:
in response to receiving, from a control server, instructions to install a first application selected from a plurality of applications, downloading the first application and installing the first application on the computing device, the first application being configured to demand operations from components of the computing device in response to one or more user interactions with the first application;
in response to receiving, from the control server, instructions to simulate user interactions with the first application:
transmitting, to the control server, an indication of battery capacity before executing simulated user interactions with the first application,
executing the simulated user interactions with the first application, and
transmitting, to the control server, an indication of battery capacity after executing simulated user interactions with the first application thereby capturing the change in battery capacity caused by the simulated user interactions;
in response to receiving, from a control server, instructions to uninstall the first application, uninstalling the first application;
in response to receiving, from a control server, instructions to install a second application, downloading the second application and installing the second application on the computing device;
in response to receiving, from the control server, instructions to simulate user interactions with the second application:
transmitting, to the control server, an indication of battery capacity before executing simulated user interactions with the second application,
executing the simulated user interactions with the second application, and
transmitting, to the control server, an indication of battery capacity after executing simulated user interactions with the second application thereby capturing the change in battery capacity caused by the simulated user interactions; and
in response to battery capacity of the computing device falling below a lower threshold, transmitting, to the control server, an indication that the battery capacity of the computing device is below the lower threshold, wherein the control server is configured to connect the computing device to a power supply in response to receiving the indication that the battery capacity of the computing device is below the lower threshold.

22. The non-transitory computer-readable storage medium of claim 21, wherein the computer-readable instructions further comprise instructions that, upon execution on the computing device, at least cause:
in response to receiving, from the control server, the instructions to simulate user interactions with the first application, generating the simulated user interactions.

23. The non-transitory computer-readable storage medium of claim 21, wherein the simulated user interactions comprise one or more of a simulated click, a simulated touch, and a simulated gesture.

24. The non-transitory computer-readable storage medium of claim 21, wherein the simulated user interactions are random or pseudo-random.

25. The non-transitory computer-readable storage medium of claim 21, wherein uninstalling the first application comprises removing, from the computing device, one or more files associated with the first application.

26. The non-transitory computer-readable storage medium of claim 21, wherein the computing device comprises a management agent, and wherein installing the first application, executing the simulated user interactions, transmitting the first battery capacity indication, uninstalling the first application, transmitting the second battery capacity indication, and installing the second application are performed by the management agent.

\* \* \* \* \*